US009477265B2

(12) United States Patent
Kim et al.

(10) Patent No.: US 9,477,265 B2
(45) Date of Patent: Oct. 25, 2016

(54) IMAGE DISPLAY DEVICE

(71) Applicant: LG ELECTRONICS INC., Seoul (KR)

(72) Inventors: Hyoungkyu Kim, Pyeongtaek-si (KR); Seokbong Han, Pyeongtaek-si (KR)

(73) Assignee: LG ELECTRONICS INC., Seoul (KR)

( * ) Notice: Subject to any disclaimer, the term of this patent is extended or adjusted under 35 U.S.C. 154(b) by 427 days.

(21) Appl. No.: 14/068,601

(22) Filed: Oct. 31, 2013

(65) Prior Publication Data

US 2014/0362541 A1 Dec. 11, 2014

(30) Foreign Application Priority Data

Jun. 5, 2013 (KR) ........................ 10-2013-0064842

(51) Int. Cl.
*G06F 1/16* (2006.01)
*G09G 5/00* (2006.01)
*G06F 1/18* (2006.01)
*H05K 7/02* (2006.01)

(52) U.S. Cl.
CPC ........... *G06F 1/1652* (2013.01); *G06F 1/1601* (2013.01); *G06F 1/1637* (2013.01); *G06F 1/183* (2013.01); *H05K 7/02* (2013.01)

(58) Field of Classification Search
CPC .. G06F 1/1601; G06F 1/1637; G06F 1/1652; G06F 1/183
USPC ............................ 361/679.24, 679.01–679.3, 361/679.55–679.59; 345/1.1, 1.3
See application file for complete search history.

(56) References Cited

U.S. PATENT DOCUMENTS

| 9,086,850 B2* | 7/2015 | Verschoor | G06F 1/1652 |
| 2012/0032981 A1* | 2/2012 | Hackwell | G06F 15/0291 345/650 |
| 2012/0163645 A1* | 6/2012 | Hwang | H05K 5/02 381/333 |
| 2012/0243206 A1* | 9/2012 | Wang | G09F 9/30 362/97.1 |
| 2013/0033844 A1* | 2/2013 | Ladouceur | H04M 1/0268 361/807 |
| 2013/0083496 A1* | 4/2013 | Franklin | G06F 1/1626 361/749 |
| 2013/0100392 A1 | 4/2013 | Fukushima | |
| 2013/0155655 A1* | 6/2013 | Lee | H05K 5/03 362/97.1 |

FOREIGN PATENT DOCUMENTS

| EP | 2538400 A1 | 12/2012 | |
| FI | WO 0142891 A1 * | 6/2001 | G06F 1/1615 |
| JP | 2008147784 A * | 6/2008 | |
| KR | EP 2811360 A2 * | 12/2014 | G06F 1/1601 |
| WO | 2012129247 A2 | 9/2012 | |

* cited by examiner

*Primary Examiner* — Nidhi Thaker
(74) *Attorney, Agent, or Firm* — Dentons US LLP

(57) ABSTRACT

An image display device includes a display to output an image, a first support plate disposed at a rear surface of the display for support, a second support plate spaced apart from a rear surface of the first support plate, and having electronic devices mounted thereon, and at least one hinge unit to connect the first support plate and the second support plate to each other by a hinge such that the second support plate resists transformation during transformation of the first support plate.

19 Claims, 8 Drawing Sheets

IMAGE DISPLAY DEVICE

CROSS-REFERENCE TO RELATED APPLICATION

Pursuant to 35 U.S.C. §119(a), this application claims the benefit of earlier filing date and right of priority to Korean Application No. 10-2013-0064842, filed on Jun. 5, 2013, the contents of which is incorporated by reference herein in its entirety.

BACKGROUND OF THE DISCLOSURE

1. Field of the Disclosure

This specification relates to an image display device having a supporting structure of a circuit board with electronic devices mounted thereon.

2. Background of the Disclosure

In general, an image display device (apparatus) includes both a device of recording and/or reproducing images and a device of recording and/or reproducing audio. Examples of the image display device may include a TV set, a monitor, a projector, a tablet, a smart phone and the like.

As it becomes multifunctional, the image display device can be allowed to capture still images or moving images, play music or video files, play games, receive broadcasts and the like, so as to be implemented as an integrated multimedia player.

Many efforts are undergoing to support and enhance various functions such as multimedia player in view of hardware or software improvements. A structural change and improvement for simplifying an assembly structure of the image display device may be included in the attempts (efforts) corresponding to the hardware improvement.

As one example of the structural change and improvement, various studies and proposals for a supporting structure of a circuit board having electronic devices mounted thereon have been introduced. Specifically, a flexible display has been actively studied in recent time. To implement the flexible display, a circuit board has to curve together with a display or remain in a flat state even when the display is varied. Generally, the circuit board is unable to curve together with the display because of being made of a rigid material. Therefore, a structure in which the flat state of the circuit board is maintained even during transformation of the display needs to be taken into account.

SUMMARY OF THE DISCLOSURE

Therefore, an aspect of the detailed description is to provide an image display device having a supporting structure of a circuit board, which is different from the related art.

Another aspect of the detailed description is to provide a structure capable of maintaining a flat state of a circuit board and/or resist variation (transformation) even during variation (transformation) of a display in an image display device having a flexible display.

To achieve these and other advantages and in accordance with the purpose of this specification, as embodied and broadly described herein, there is provided an image display device including a display to output an image, a first support plate disposed at a rear surface of the display for support, a second support plate spaced apart from a rear surface of the first support plate, and having electronic devices mounted thereon, and at least one hinge unit to connect the first support plate and the second support plate to each other by a hinge such that the second support plate resists transformation during transformation of the first support plate.

In accordance with one exemplary embodiment, a plurality of hinge units may be disposed on both sides of the second support plate.

In accordance with another exemplary embodiment, a hinge unit may include a hinge bar coupled to the first support plate, and a hinge plate coupled to the hinge bar by a hinge, the hinge plate configured to support the second support plate.

The hinge bar may be mounted onto a first protruding portion protruding from the rear surface of the first support plate, such that the hinge plate is spaced apart from the rear surface of the first support plate. Also, the second support plate may be mounted onto a second protruding portion protruding from the hinge plate, such that the second support plate is spaced apart from the rear surface of the first support plate.

The hinge bar may include a first accommodating portion, and the hinge plate may include a second accommodating portion disposed coaxially with the first accommodating portion. A pin may be inserted into the first and second accommodating portions such that the hinge bar and the hinge plate are rotatable relative to each other.

The hinge bar and the hinge plate may be made of a metal. Here, the first and second accommodating portions may be formed by bending the hinge bar and the hinge plate, respectively.

The hinge bar and the hinge plate may extend along an axial direction of the pin, and the first and second accommodating portions may be disposed on a plurality of places including an end portion of the pin on an axis of the pin.

The hinge plate may include a stopper stopped at the hinge bar upon rotation of the hinge plate in one direction, so as to limit a rotation range of the hinge plate relative to the hinge bar. The stopper may be disposed to cover a part of the hinge bar. Also, an elastic member may be disposed between the stopper and the hinge bar. The elastic member may be made of an elastically transformable material. The second support plate may be disposed on the rear surface of the first support plate at a position protruding more than the stopper.

In accordance with another exemplary embodiment, the second support plate may be a circuit board to generate a control signal related to the display. The second support plate and the electronic devices mounted onto the second support plate may configure a power supply unit for supplying power to the display. A connector may be disposed on an end portion of the circuit board to be coupled to another connector. The connector may be disposed on the rear surface of the second support plate at a position protruding more than the hinge unit, to facilitate the another connector to be easily inserted into the connector without interference with the hinge unit.

In accordance with another exemplary embodiment, the second support plate may be provided in plurality, to be arranged in a row, and the hinge units disposed on both sides of the second support plate may extend in one direction to be connected to the plurality of second support plates, respectively.

In accordance with another exemplary embodiment, the image display device may further include a holding unit disposed between the first support plate and the second support plate so as to prevent the second support plate from being drooped due to its own weight.

The holding unit may include a body supported by the first support plate and inserted through a through hole formed through the second support plate, and an elastic member disposed between the first support plate and the second support plate to cover the body to elastically press the second support plate. Also, the holding unit may further include an anti-separation portion protruding from the body in a radial direction to cover a portion of the rear surface of the second support plate.

In accordance with another exemplary embodiment, the image display device may further include a rear cover disposed to cover the second support plate and transformable in response to transformation of the first support plate. The rear cover may be spaced apart from an edge of the second support plate by a predetermined gap to be prevented from coming in contact with the second support plate upon the transformation.

In accordance with another exemplary embodiment, the image display device may further include a third support plate spaced apart from the rear surface of the first support plate, and a transformation reducing portion having a smaller area than the third support plate and configured to connect the first support plate and the third support plate to each other, so as to allow the third support plate to resist transformation during the transformation of the first support plate.

In addition, to achieve the aspects and other advantages of the present disclosure, there is provided an image display device including a display to output an image, a support plate disposed at a rear surface of the display for support, a plurality of protruding portions each protruding from a rear surface of the support plate, the plurality of protrusions being spaced apart from each other, a plurality of hinge bars mounted onto the plurality of protrusions, respectively, a plurality of hinge plates coupled to the plurality of hinge bars, respectively, by hinges, and a circuit board supported by the plurality of hinge plates, and to generate a control signal related to the display, wherein the circuit board remains flat as the hinge bars are rotated with respect to the hinge plates during transformation of the support plate.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings.

For the sake of brief description with reference to the drawings, the same or equivalent components may be provided with the same reference numbers, and description thereof may not be repeated.

Hereinafter, suffixes "module" and "unit or portion" refer to components used herein for description purposes and they do not impart a specific meaning or function.

The expression in the singular form in this specification will cover the expression in the plural form unless otherwise indicated obviously from the context.

An image display device according to the present disclosure may include both a device of recording and/or reproducing images and a device for recording and/or reproducing audio by receiving and outputting broadcasts. Hereinafter, a TV as an example of the image display device will be illustrated.

Figure 1:
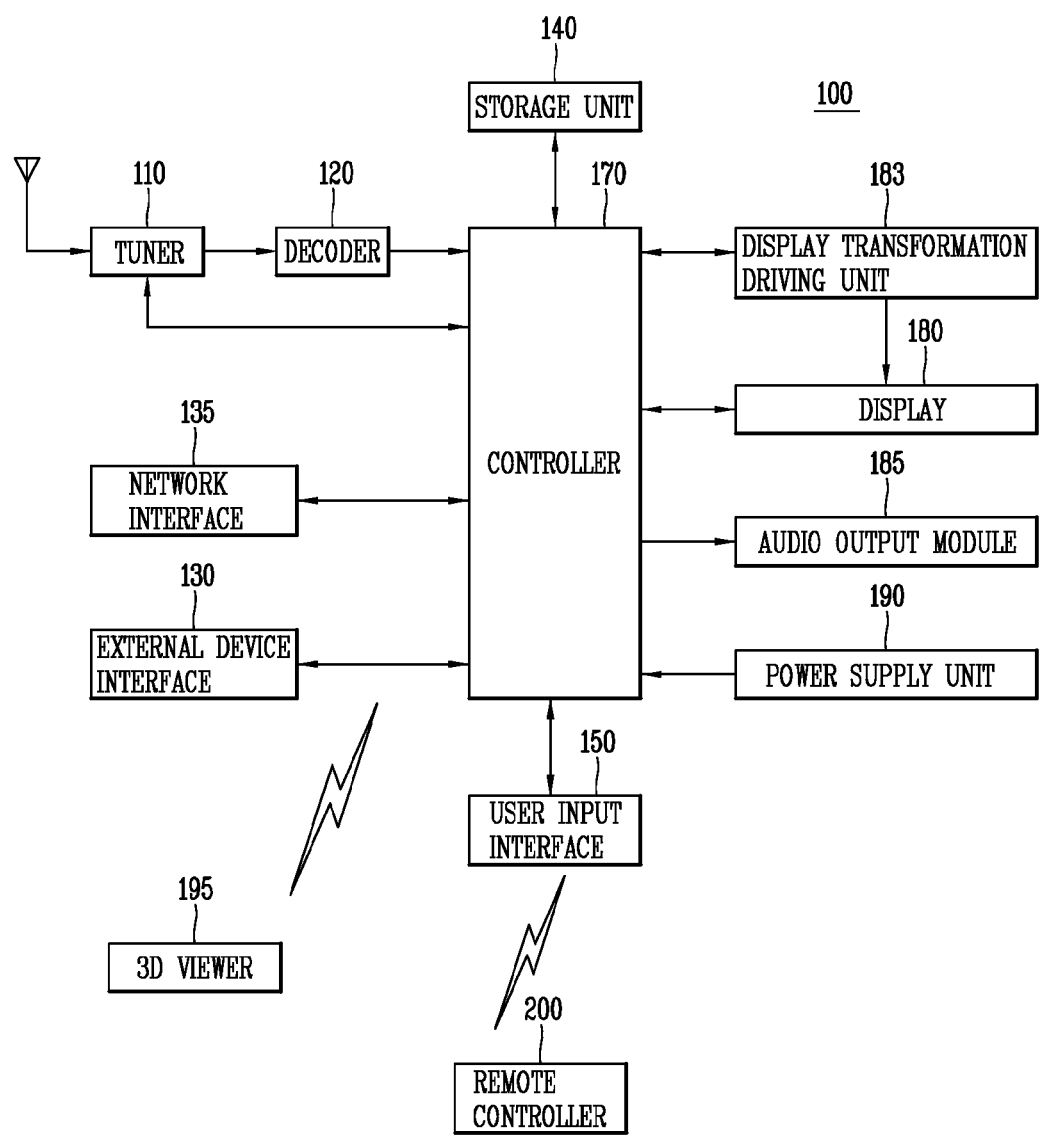
FIG. 1 is a block diagram of an image display device and a remote controller in accordance with an exemplary embodiment of the present disclosure.

FIG. 1 is a block diagram of an image display device 100 and a remote controller 200 according to the present disclosure.

As illustrated in FIG. 1, the image display device 100 may include a tuner 110, a decoder 120, an external device interface 130, a network interface 135, a storage unit 140, a user input interface 150, a controller 170, a display 180, a display transformation driving unit 183, an audio output module 185, a power supply unit 190, and a 3D viewer 195.

The tuner 110 may select a radio frequency (RF) broadcast signal, which corresponds to a channel selected by a user, among RF broadcast signals received through an antenna, or every pre-stored channel. The tuner 110 may also convert the selected RF broadcast signal into a medium frequency signal or a baseband video or audio signal.

For example, when the RF broadcast signal selected is a digital broadcast signal, the tuner 110 may convert the RF broadcast signal into a digital IF signal (DIF). On the other hand, when the RF broadcast signal is an analog broadcast signal, the tuner 110 may convert the RF broadcast signal into an analog baseband video or audio signal (CVBS/SIF). That is, the analog baseband image or audio signal (CVBS/SIF) outputted from the tuner 110 may be inputted directly into the controller 170.

Also, the tuner 110 may receive a signal carrier RF broadcast signal according to an advanced television systems committee (ATSC) standard or a multi-carrier RF broadcast signal according to a digital video broadcasting (DVB) standard.

Meanwhile, the tuner 110 may sequentially select RF broadcast signals of all the broadcast channels stored through a channel memory function, of RF broadcast signals received via an antenna, and convert those RF broadcast signals into a medium frequency signal or a baseband video or audio signal.

The decoder 120 may execute a decoding operation by receiving a digital IF signal (DIF) converted in the tuner 110.

For example, when the digital IF signal outputted from the tuner 110 is a signal according to the ATSC standard, the decoder 120 may perform 8-vestigal side band (8-VSB) demodulation. Here, the decoder 120 may also perform trellis decoding, de-interleaving, reed Solomon decoding and the like. To this end, the decoder 120 may include a trellis decoder, de-interleaver, a reed Solomon decoder and the like.

As another example, when the digital IF signal (DIF) outputted from the tuner 110 is a signal according to the DVB standard, the decoder 120 may perform a coded orthogonal frequency division modulation (COFDMA) demodulation. Here, the decoder 120 may also perform convolution decoding, de-interleaving, reed Solomon decoding and the like. To this end, the decoder 120 may include a convolution decoder, a de-interleaver, a reed Solomon decoder and the like.

The decoder 120 may output a stream signal after decoding and channel decoding. Here, the stream signal may be a signal in which a video signal, an audio signal and a data signal are multiplexed. As one example, the stream signal may be an MPEG-2 transport stream (TS) signal obtained by multiplexing an MPEG-2 video signal and a Dolby AC-3 audio signal. In detail, an MPEG-2 TS signal may include a 4-byte header and a 184-byte payload.

The decoder 120 may be provided separately according to the ATSC standard and the DVB standard. That is, an ATSC decoder and a DVB decoder may be provided.

The stream signal output from the decoder 120 may be inputted into the controller 170. The controller 170 may perform demultiplexing, video/audio signal processing and the like, output video on the display 180 and output audio to the audio output module 185.

The external device interface 130 may connect an external device and the image display device 100 to each other. To this end, the external device interface 130 may include an NV input/output unit (not shown) or a wireless communication unit (not shown).

The external device interface 130 may be connected, in a wired or wireless manner, to an external device, such as a digital versatile disk (DVD), a Bluray, a game machine, a camera, a camcorder, a laptop computer (notebook) and the like. The external device interface 130 may transfer a video, audio or data signal input from the exterior via the connected external device to the controller 170 of the image display device 100, and also output a video, audio or data signal processed in the controller 170 to the external device. For this, the external device interface 130 may include the A/V input/output unit or the wireless communication unit.

The A/V input/output unit may include a USB terminal, a composite video banking sync (CVBS) terminal, a component terminal, a S-video terminal (analog), a digital visual interface (DVI) terminal, a high definition multimedia interface (HDMI) terminal, an RGB terminal, a D-SUB terminal, and the like to allow video and audio signals of the external device to be inputted into the image display device 100.

The wireless communication unit may execute short-range wireless communication with other electronic devices. The image display device 100 may be connected to the other electronic device via a network according to communication standards, such as Bluetooth, radio frequency identification (RFID), infrared data association (IrDA), ultra wideband (UWB), Zigbee and the like.

The external device interface 130 may also be connected via at least one of various set-top boxes and the aforementioned various terminals, to execute input/output operations with the set-top boxes.

The external device interface 130 may execute data transmission and reception with the 3D viewer 195.

The network interface 135 may provide an interface for connecting the image display device 100 to a wired or wireless network which includes an Internet network. The network interface 135 may include an Ethernet terminal for connection to the wired network, and use communication standards, such as wireless LAN (WLAN) (Wi-Fi), wireless broadband (Wibro), world interoperability for microwave access (Wimax), high speed downlink packet access (HS-DPA) and the like for connection to the wireless network.

The network interface 135 may receive contents or data provided by a contents provider or a network operator via a network. That is, the network interface 135 may receive contents, such as a movie, an advertisement, a game, a VOD, a broadcast signal provided by the network operator, and related information via a network. The network interface 135 may also receive update information related to firmware and update files provided by the network operator. Also, the network interface 135 may transmit data to the contents provider or the network operator.

The network interface 135 may be connected to, for example, an Internet protocol (IP) TV, so as to receive a video, audio or data signal processed in an IPTV set-top box and transfer it to the controller 170. The network interface 135 may also transfer signals processed in the controller 170 to the IPTV set-top box.

The IPTV may indicate ADSL-TV, VDSL-TV, FTTH-TV or the like or indicate TV over DSL, Video over DSL, TV overIP (TVIP), Broadband TV (BTV) or the like, according to a type of transmission network. Also, the IPTV may indicate an Internet-accessible Internet TV, and a full-browsing TV.

The storage unit 140 may store programs for signal processing and control by the controller 170, and also store processed video, audio or data signals.

The storage unit 140 may execute a function of temporarily storing a video, audio or data signal input via the external device interface 130. Also, the storage unit 140 may store information related to a predetermined broadcast channel through a channel memory function of a channel map and the like.

The storage unit 140 may include at least one storage medium of a flash memory-type storage medium, a hard disc-type storage medium, a multimedia card micro-type storage medium, a card-type memory (for example, SD or XD memory), a random access memory (RAM), a read-only memory (ROM) (e.g., electrically erasable programmable ROM (EEPROM)), and the like. The image display device 100 may reproduce a file (a video file, a still image file, a music file, a document file, etc.) stored in the storage unit 140 to provide to a user.

FIG. 1 illustrates an exemplary embodiment having the storage unit 140, separate from the controller 170. However, the storage unit 140 may alternatively be configured to be included in the controller 170.

The user input interface 150 may transfer a user-input signal to the controller 170, or a signal from the controller 170 to the user.

For example, the user input interface 150 may receive a user input signal, such as a power on/off, a channel selection, a screen setting and the like from the remote controller 200, or transmit a signal from the controller to the remote controller 200, according to various communication standards, such as RF communication, IR communication and the like.

The user input interface 150 may also transfer a user input signal, which is inputted from a local key (not shown), such as a power key, a channel key, a volume key, or a setting key, to the controller 170, for example.

Also, for example, the user input interface 150 may transfer a user input signal, which is inputted from a sensing unit (not shown) for sensing a user's gesture, to the controller 170 or transmit a signal from the controller 170 to the sensing unit (not shown). Here, the sensing unit may include a touch sensor, a voice sensor, a position sensor, a motion sensor and the like.

The controller 170 may demultiplex stream, which is inputted via the tuner 110, the decoder 120 or the external device interface 130 or process the demultiplexed signals, to generate and output signals for outputting video or audio.

The video signal processed in the controller 170 may be inputted to the display 180 to be outputted as an image corresponding to the image signal. Also, the video signal processed in the controller 170 may be inputted to an external output device through the external device interface 130.

The audio signal processed in the controller 170 may be outputted to the audio output module 185. The audio signal processed in the controller 170 may be inputted to an external output device through the external device interface 130. Although not shown in FIG. 1, the controller 170 may include a demultiplexer, an image processor and the like.

Besides, the controller 170 may control an overall operation of the image display device 100. For example, the controller 170 may control the tuner 110 to select an RF broadcast corresponding to a user-selected channel or a pre-stored channel.

The controller 170 may also control the image display device 100 by a user command inputted via the user input interface 150 or an internal program.

For example, the controller 170 may control the tuner 110 to input a signal of a channel, which is selected in response to a predetermined channel select command received via the user input interface 150. The controller 170 may then process a video, audio or data signal of the selected channel. The controller 170 may control information related to the user-selected channel to be outputted through the display 180 or the audio output module 185 together with the processed video or audio signal.

As another example, the controller 170 may control a video signal or an audio signal, which is inputted from an external device, for example, a camera or a camcorder through the external device interface 130 in response to an external device image reproduce command received through the user input interface 150, to be outputted through the display 180 or the audio output module 185.

In the meantime, the controller 170 may control the display 180 to display an image. For example, the controller 170 may control the display 180 to output a broadcast image inputted through the tuner 110, an externally input image inputted through the external device interface 130, an image inputted through the network interface 135, or an image stored in the storage unit 140.

Here, the image output on the display 180 may be a still image or a video, and a 2D or 3D image.

The controller 170 may allow a predetermined object within the image displayed on the display 180 to be generated and displayed as a 3D object. For example, the object may be at least one of an accessed web screen (a newspaper, a journal, etc.), an electronic program guide (EPG), various menus, a widget, an icon, a still image, a video, and text.

The 3D object may be processed to have a different depth from the image displayed on the display 180. Preferably, the 3D object may be processed to seem to protrude more than the image displayed on the display 180.

In the meantime, the controller 170 may recognize a user's location based on an image captured by the capturing element (not shown). For example, the controller 170 may recognize a distance (z-axial coordinates) between the user and the image display device 100. Also, the controller 170 may recognize x-axial coordinates and y-axial coordinates within the image display device 100 corresponding to the user's location.

Although not shown, the image display device 100 may further include a channel browsing processor, which generates a thumbnail image corresponding to a channel signal or an externally input signal. The channel browsing processor may receive a stream signal outputted from the decoder 120 or a stream signal outputted from the external device interface 130, extract an image from the input stream signal, and generate a thumbnail image. The generated thumbnail image may be inputted to the controller 170 as it is or after being encoded. Also, the generated thumbnail image may be inputted to the controller 170 after being encoded into a stream format. The controller 170 may output on the display 180 a thumbnail list including a plurality of thumbnail images using the input thumbnail image. The thumbnail list may be displayed in a briefly viewing manner in which the list is displayed on a partial region with displaying a predetermined image on the display 180, or in a fully viewing manner in which the list is displayed on most regions of the display 180.

The display 180 may generate a driving signal by converting an image signal, a data signal, an OSD signal and a control signal processed in the controller 170, or an image signal, a data signal and a control signal received via the external device interface 130.

The present disclosure illustrates that the display 180 is configured as a flexible display which is transformable (variable) into a flat form or a curved form. When the display 180 is transformed into the curved form like surrounding a user located in front thereof, the display 180 may provide the user with intense quality of image and allow the user to feel more involved in an image displayed thereon. The flexible display may be implemented by an OLED panel, for example.

The display 180 may be configured to provide a 3D image to a user. To view the 3D image, the display 180 may be classified into an additional displaying method and an independent displaying method.

The independent displaying method may be configured such that a 3D image can be implemented only by the display 180 without a separate 3D viewer 195, for example, 3D glasses or the like. Various technologies such as a lenticular technology, a parallax barrier technology and the like may be applied as the independent displaying method.

The additional displaying method may be configured to implement a 3D image by using the 3D viewer 195 in addition to the display 180. As one example, various methods such as a head mount display (HMD) type, a glass type and the like may be applied. Also, the glass type may be divided into a passive glass type such as a polarized glass type and the like, and an active glass type such as a shutter glass type and the like. The HMD type may also be divided into a passive HMD type and an active HMD type.

The display 180 may be implemented as a touch screen so as to be used as an input device as well as an output device.

The display transformation driving unit 183 may transform the display 180 into a flat form or a curved form. The display transformation driving unit 183 may transmit an electric signal to the display 180 such that the display 180 can be transformed by itself, or apply a physical force to the display 180 directly or indirectly to transform the display 180.

The audio output module 185 may output sound by receiving an audio signal processed in the controller 170, for example, a stereo signal, a 3.1 channel signal or a 5.1 channel signal. The audio output module 185 may be implemented into various types of speakers.

Meanwhile, to sense a user's gesture, as aforementioned, the image display device 100 may further include a sensing unit (not shown) having at least one of a touch sensor, a voice sensor, a location sensor, and a motion sensor. A signal sensed by the sensing unit may be transferred to the controller 170 via the user input interface 10.

The controller 170 may sense a user's gesture based on an image captured by the capturing element (not shown), a signal sensed by the sensing unit (not shown) or a combination thereof.

The power supply unit 190 may supply power to every component of the image display device 100. Especially, the power supply unit 190 may supply power to the controller 170 which may be implemented in a form of a system on chip (SOC), the display 180 to display an image, and the audio output module 185 to output an audio. Also, depending on embodiments, power may be supplied using a heat generator including a hot wire.

The remote controller 10 may transmit a user input to the user input interface 150. To this end, the remote controller 10 may use various communication standards, such as IR communication, RF communication, Bluetooth, ultra wideband (UWB), Zigbee and the like. Also, the remote controller 10 may receive a video, audio or data signal output from the user input interface 150, so as to display the signal on the remote controller 10 or output the signal on the remote display 10 in form of sound.

The image display device 100 may be a fixed digital broadcast receiver capable of receiving at least one of ATSC (8-VSB) broadcast programs, DVB-T (COFDM) broadcast programs, and ISDB-T (BST-OFDM) broadcast programs or a mobile digital broadcast receiver capable of receiving at least one of terrestrial DMB broadcast programs, satellite DMB broadcast programs, ATSC-M/H broadcast programs, DVB-H (COFDM) broadcast programs, and Media Forward Link Only (MediaFLO) broadcast programs. Alternatively, the image display device 100 may be an IPTV digital broadcast receiver capable of receiving cable broadcast programs, satellite broadcast programs or IPTV programs.

The image display device disclosed herein may include a TV receiver, a cellular phone, a smart phone, a notebook computer, a digital broadcasting terminal, a personal digital assistant (PDA), a portable multimedia player (PMP) and the like.

The block diagram of the image display device illustrated in FIG. 1 is a block diagram of one exemplary embodiment. Each component of the block diagram may be combined, added or omitted according to the configuration of the image display device 100. That is, if necessary, two or more components may be combined into one component, or one component may be divided into two components. Also, a function performed in each block is merely illustrative, and a detailed operation or device may not limit the scope of the present disclosure.

Figure 2:
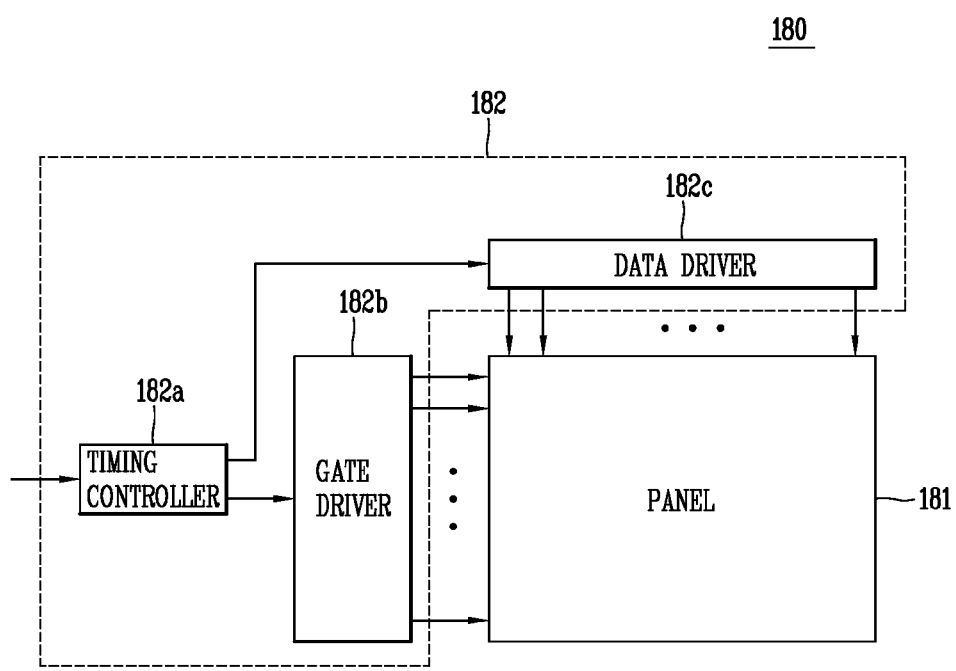
FIG. 2 is a block diagram illustrating in detail a display of FIG. 1.

FIG. 2 is a block diagram illustrating the display 180 of FIG. 1 in detail.

As illustrated in FIG. 2, the display 180 may be a display module including an OLED panel (hereinafter, panel 181) and a driving circuit unit 182.

The panel 181 may have a structure including an electron transport layer for transporting electrons on a cathode and providing the electrons to an organic material, a hole transport layer for transporting holes on an anode and providing the holes to the organic material, and an emission layer located between the electron transport layer and the hole transport layer for emitting light by coupling of the electrons and the holes.

The driving circuit unit 182 may drive the panel 181 by use of a control signal applied from the controller 170 of FIG. 1. To this end, the driving circuit unit 182 may include a timing controller 182a, a gate driver 182b and a data driver 182c.

The timing controller 182a may receive a control signal, an RGB data signal, or a vertical synchronous signal (Vsync) from the controller 170, so as to as control the gate driver 182b and the data driver 182c in correspondence with the control signal, and rearrange the RGB data signal to provide to the data driver 182c.

The gate driver 182b and the data driver 182c may supply a scan signal and an image signal to the panel 181 through a gate line GL and a data line DL according to the control of the timing controller 182a.

Figure 3:
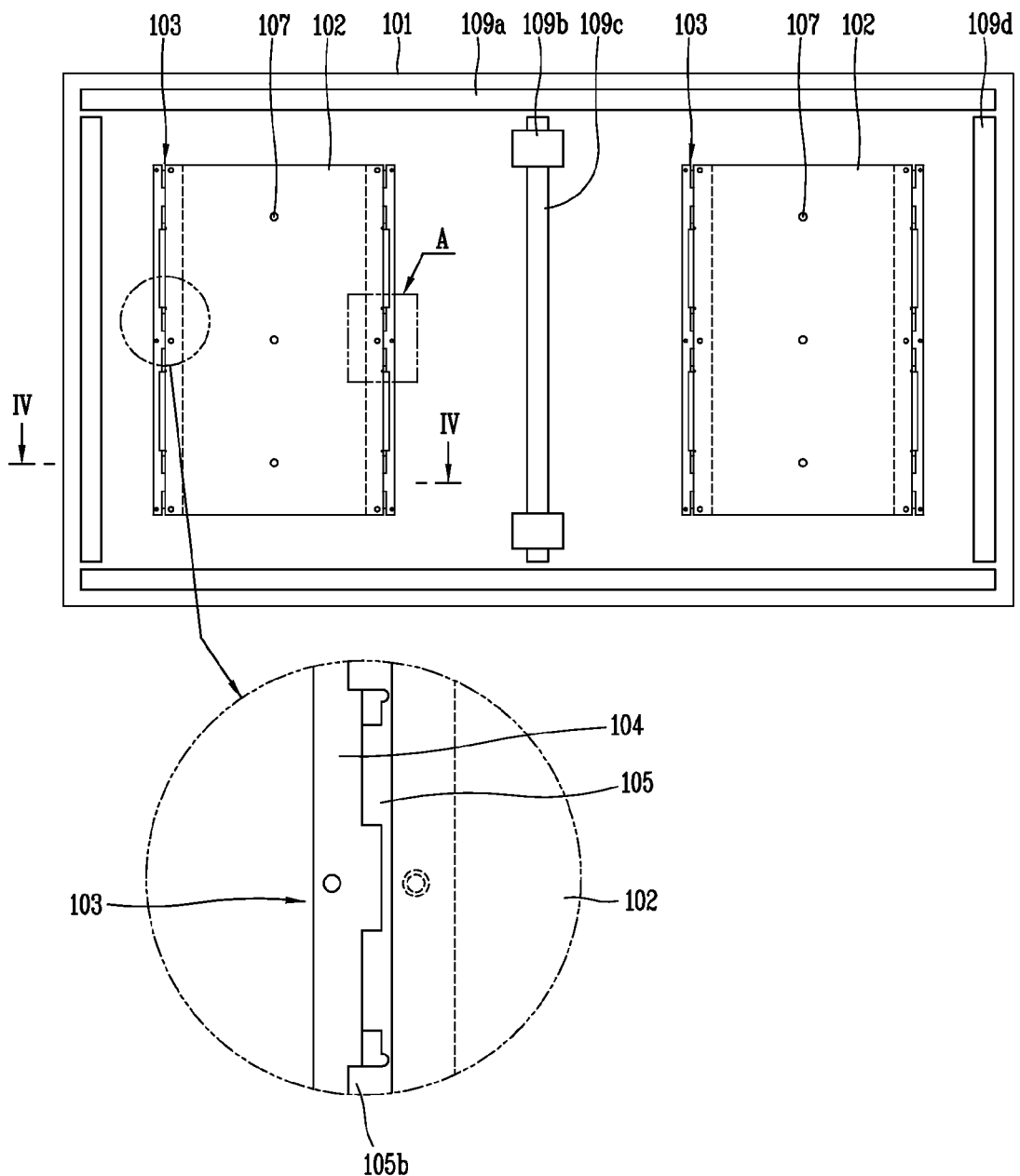
FIG. 3 is a rear view of an image display device in accordance with one exemplary embodiment of the present disclosure.

FIG. 3 is a rear view of the image display device 100 in accordance with the one exemplary embodiment.

Figure 4A:
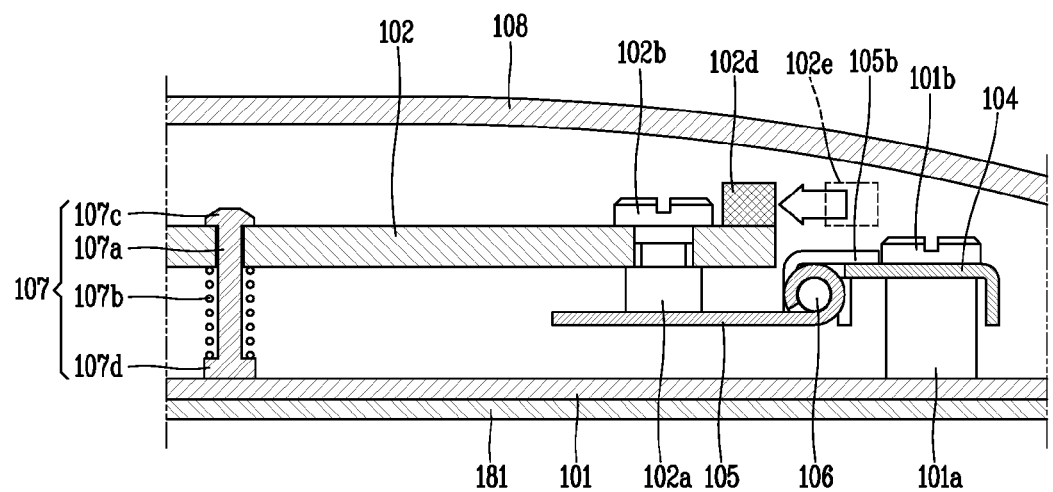
FIGS. 4A and 4B are sectional views taken along the line IV-IV of FIG. 3, which respectively illustrate a non-transformed (non-varied) state and a transformed (varied) state of a first support plate.

As illustrated in FIG. 3, a first support plate 101 may cover a rear surface of the display 180, in detail, the panel 181 of FIG. 4A. The first support plate 101 may be transformable together with the display 180. The first support plate 101 may be made of a predetermined material which is elastically transformable, for example, stainless steel, titanium, carbon fiber and the like.

The display transformation driving unit 183 (see FIG. 1) may transform the display 180 supported by the first support plate 101 into the flat form or the curved form. For example, when the display transformation driving unit 183 presses on both sides of the first support plate 101, the display 180 may be transformed into the curved form to surround a user located in front thereof. In this state, when the display transformation driving unit 183 pulls on both sides of the first support plate 101, the display 180 may be restored to the flat form.

In the drawing, to implement such structure, the first support plate 101 may include a wing 109a formed to transform the first support plate 101, and a driving source 109b to drive the wing 109a.

The wing 109a may be a plate in a form of a bar, and disposed along a horizontal direction of the first support plate 101 in the drawing. For a stable operation, the wing 109a may preferably be provided in plurality. For example, the wings 109a may be disposed at both sides of a hinge unit 103.

The wing 109a may be mechanically connected to the driving source 109b. The wing 109a may be pressed or pulled as the driving source 109b is driven. In FIG. 3, the driving source 109b may be mounted onto a center bar 109c installed on a central portion of the first support plate 101. The center bar 109c may have a thin width so as to be minutely transformed during transformation of the first support plate 101. This may prevent a transformation force from being applied to the driving source 109b mounted onto the center bar 109c.

The first support plate 101 may have a rigid bar 109d which is installed to prevent the first support plate 101 from being twisted (warped) during the transformation. The exemplary embodiment illustrates that rigid bar 109d is disposed along a vertical direction, in the drawing, of the first support plate 101 to prevent the first support plat 101 from being transformed in the vertical direction. For structural stability, the rigid bar 109d may be provided in plurality to be installed on both sides of the first support plate 101.

A second support plate 102 may be disposed on a rear surface of the first support plate 101 while being spaced from the first support plate 101 by a predetermined interval. In FIG. 3, the second support plate 102 may be provided in plurality to be disposed on both sides of the first support plate 101.

An electronic device (electronic components, not shown) may be mounted onto at least one surface of the second support plate 102. The second support plate 102 may be implemented as a circuit board for generating a control signal related to the display 180. The control signal may include a power signal as well as a data signal involved with driving of the display 180. For example, the circuit board and the electronic device mounted thereon may be configured as a power supply unit (PSU) for supplying power to the display 180.

The second support plate 102 may be coupled to the first support plate 101 by a hinge to be maintained in the flat state even during the transformation of the first support plate 101. Hence, electronic devices or internal structures which are likely to be damaged during transformation may be installed on the second support plate 102, which is always maintained in the flat state, so as to be protected from damage.

The drawing illustrates that the second support plate 102 is connected directly to the first support plate 101 by a hinge, but the present disclosure may not be limited to this. The second support plate 102 may be indirectly coupled to the first support plate 101 by being mounted onto an intermediate member, which is coupled directly to the first support plate 101 by a hinge.

The hinge unit 103 may be provided on each of both sides of the second support plate 102. However, in an alternative embodiment, one hinge unit 103 is provided to one side of the second support plate 102 and the other side may be fixed to the first support plate 102, for example, through a protruding portion (similar to protruding portion 101a (see FIG. 4A)). In FIG. 3, each hinge unit 103 may extend in one direction of the second support plate 102. The one direction may correspond to the vertical direction of the first support plate 101.

Hereinafter, a detailed structure of the hinge unit 103 may be described in more detail.

Figure 4B:
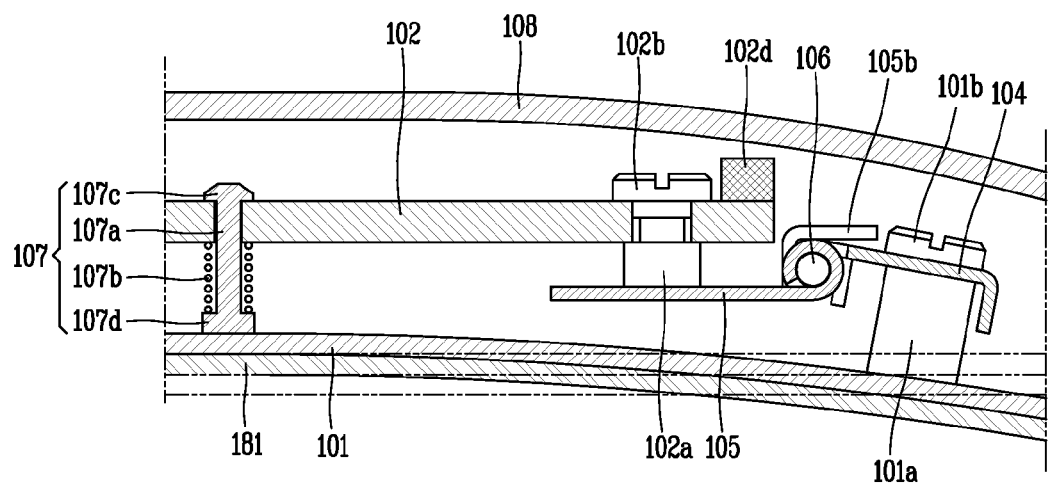
Figure 5A:
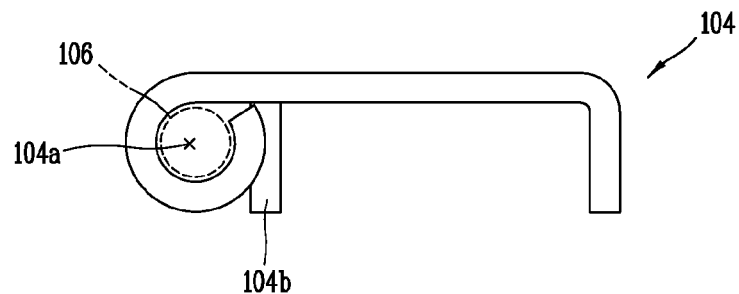
FIGS. 5A and 5B are conceptual views which respectively illustrate a hinge bar and a hinge plate illustrated in FIG. 4A.
Figure 5B:
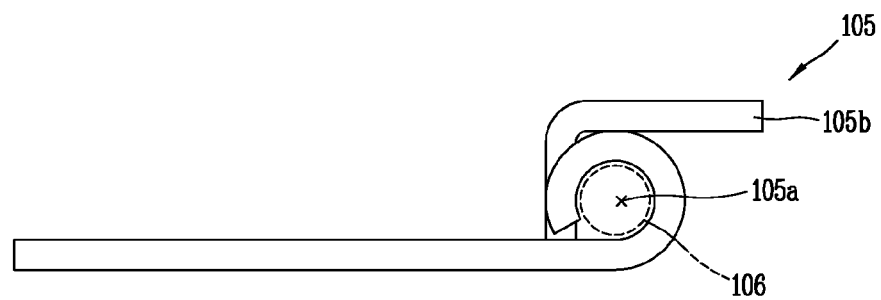

FIGS. 4A and 4B are sectional views taken along the line IV-IV of FIG. 3, which respectively illustrate a non-transformed state and a transformed state of the first support plate 101. FIGS. 5A and 5B are conceptual views which respectively illustrate a hinge bar and a hinge plate illustrated in FIG. 4A.

As illustrated in FIGS. 4A and 4B and FIGS. 5A and 5B, the hinge unit 103 may include a hinge bar 104, and a hinge plate 105.

The hinge bar 104 may be connected to the first support plate 101. The hinge bar 104 may be mounted onto a first protruding portion 101a which protrudes from a rear surface of the first support plate 101. The first protruding portion 101a may be formed as a pem nut to fix a first coupling member 101b, which penetrates through the hinge bar 104. According to the structure, the hinge plate 105 connected to the hinge bar 104 may be spaced from the rear surface of the first support plate 101, ensuring a predetermined spaced distance in view of the transformation of the first support plate 101.

The hinge plate 105 may be coupled to the hinge bar 104 by a hinge to support the second support plate 102. The second support plate 102 may be mounted directly onto the hinge plate 105, or mounted onto a second protruding portion 102a formed on the hinge plate 105. The second protruding portion 102a may be configured as a pem nut, similar to the first protruding portion 101a, to fix the second coupling member 102b penetrating through the second support plate 102. According to the structure, the second support plate 102 may be spaced farther away from the rear surface of the first support plate 101. Accordingly, a mounting plate for other components (for example, a lead wire, an insulating sheet, etc.) may be formed on a front surface of the second support plate 102 facing the first support plate 101.

The spaced distance between the first support plate 101 and the second support plate 102 may preferably be set by taking into account the transformation of the first support plate 101, drooping of the second support plate 102, heights of other components installed on a surface of the first or second support plate 101, 102 facing the other plate, and the like.

The hinge bar 104 and the hinge plate 105 may be coupled by a pin 106 so as to be rotatable relative to each other. As one example, the hinge bar 104 may include a first accommodation portion 104a, and the hinge plate 105 may include a second accommodating portion 105a disposed coaxially with the first accommodation portion 104a. The pin 106 may be inserted into the first and second accommodating portions 104a and 105a so as to couple the hinge bar 104 and the hinge plate 105 to each other. Accordingly, the hinge bar 104 and the hinge plate 105 may be rotatable around the pin 106.

The hinge bar 104 and the hinge plate 105 may be made of a metal, and the first and second accommodating portions 104a and 105a may be formed by bending the hinge bar 104 and the hinge plate 105, respectively. Unlike to this, the hinge bar 104 and the hinge plate 105 may be formed by an injection molding. The drawings illustrate a structure that an end portion of the hinge bar 104 is rolled down to form the first accommodating portion 104a and an end portion of the hinge plate 105 is rolled up to form the second accommodating portion 105a.

Referring to FIG. 3 again, the hinge bar 104 and the hinge plate 105 may extend in an axial direction of the pin 106. Here, if the end portion of the hinge unit 103 is not coupled by the pin 106, a clearance may be generated. Therefore, for firm coupling between the hinge bar 104 and the hinge plate 105, the first and second accommodating portions 104a and 105a may preferably be disposed on a plurality of places including an end portion of the pin 106 on an axis of the pin 106.

Referring to FIGS. 4A and 4B, when both end portions of the first support plate 101 move forwardly or the center of the first support plate 101 move backwardly to surround a user located in front of the image display device 100, the hinge bar 104 may be rotated relative to the hinge plate 105 around the pin 106. On the contrary, since the hinge plate 105 may maintain its position even when the first support plate 101 is transformed, the second support plate 102 supported by the hinge plate 105 may remain flat.

Therefore, when the structure is applied to the image display device 100 having the display 180, a reliability issue of the circuit board may be solved.

In the meantime, a rear cover 108 may be disposed on the second support plate 102 to cover the second support plate 102. The rear cover 108 may be transformable together with the first support plate 101. Here, the rear cover 108 may be located relatively close to the second support plate 102 due to the transformation. In order to prevent the rear cover 108 from coming in contact with the second support plate 102 upon transformation, the rear cover 108 may preferably be spaced by a predetermined gap from an edge of the second support plate 102 or a component (for example, a connector 102d) mounted on the second support plate 102.

Figure 6:
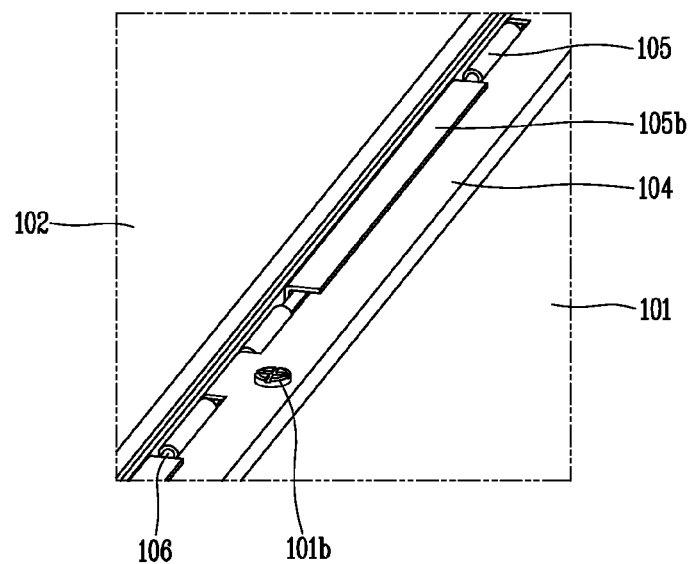
FIG. 6 is a perspective view illustrating part A illustrated in FIG. 3 in a three-dimensional manner.

FIG. 6 is a perspective view illustrating part A illustrated in FIG. 3 in a 3D form.

A stopper 105b for limiting a relative rotation range may be disposed on the hinge unit 103. As one example, referring to FIG. 6 and FIG. 4A, the stopper 105b may have a form that a part of the hinge plate 105 is bent, and stopped at the hinge bar 104 upon rotation of the hinge plate 105.

In the drawings, the stopper 105b may be disposed to cover a part of the hinge bar 104. The stopper 105b may be disposed with coming in contact with the hinge bar 104 or with being spaced apart from the hinge bar 104 by a predetermined gap. According to the structure, when the hinge unit 103 receives a rotational force in an opposite direction to a set direction in which it is rotatable in response to movement due to sound, vibration and the like, the stopper 105b may be stopped by the hinge bar 104 so as to be prevented from being rotated.

Although not shown, an elastic member (not shown) made of an elastically transformable material may be disposed between the stopper 105b and the hinge bar 104. For example, the elastic member may be made of silicon, rubber, sponge and the like. By employing the elastic member, frictional sound, vibration and the like, which may be generated when the stopper 105b comes in contact with the hinge bar 104, may be reduced.

In the meantime, a protrusion 104b may be formed on a portion of the hinge bar 104, corresponding to the stopper 105b, to cover at least part of the pin 106 together with the stopper 105b.

Referring to FIG. 4A, a connector 102d may be disposed on an end portion of the second support plate 102 configured as the circuit board, to be coupled to another connector 102b. Here, when the hinge unit 103 is protruding more than or higher than the connector 102d, interference due to a gap may be caused, which may disable a horizontal assembly between the connector 102d and the another connector 102e.

For enabling the horizontal connection between the connector 102d and the another connector 102d, the connector 102d may be disposed on the rear surface of the second support plate 102 at a position more protruding than or higher than the hinge unit 103. The drawing illustrates that the connector 102d is protruding more than or higher than the stopper 105b. With the structure, the another connector 102e may be easily inserted into the connector 102d without interference with the hinge unit 103.

Figure 7A:
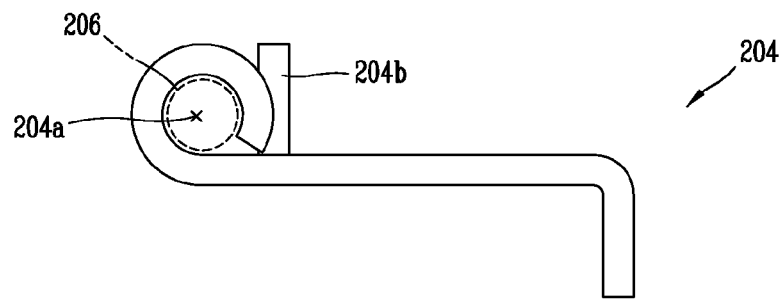
FIGS. 7A and 7B are conceptual views which respectively illustrate variations of the hinge bar and the hinge plate.
Figure 7B:
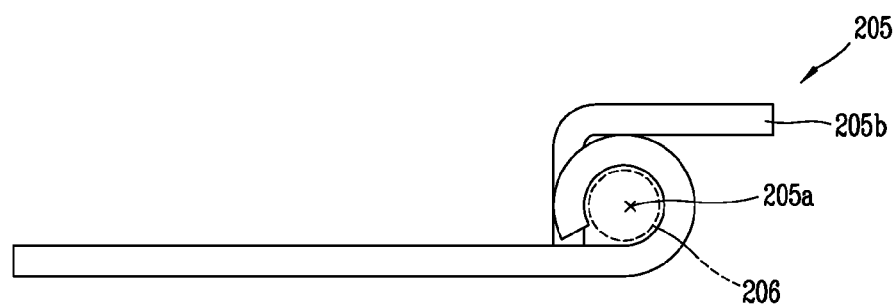

FIGS. 7A and 7B are conceptual views which respectively illustrate variations of the hinge bar 204 and the hinge plate 205;

FIGS. 7A and 7B exemplarily illustrate that an end portion of a hinge bar 204 is rolled up to form a first accommodating portion 204a. Also, a stopping protrusion 204b by which a stopper 205b is stopped may be disposed on an end portion corresponding to the stopper 205b. A hinge plate 205 may have the same structure as the aforementioned embodiment.

Since the stopper 205b is stopped with contacting one surface of the hinge bar 204 in the aforementioned embodiment, a rotation angle at which the stopper 205b is stopped may be difficult to change. On the contrary, according to the variation, a length, an angle and the like of the stopping protrusion 204b may be adjustable so as to facilitate adjustment of the rotation angle for stopping the stopper 205b.

The stopping protrusion 204b may be formed to cover at least part of the pin 206 together with the stopper 205b.

The hinge unit 103, 203 may not be limited to those aforementioned forms. The hinge unit 103, 203 may be formed in any form if it has a structure that the hinge bar 104, 204 and the hinge plate 105, 205 are coupled to be rotatable relative to each other.

Figure 8:
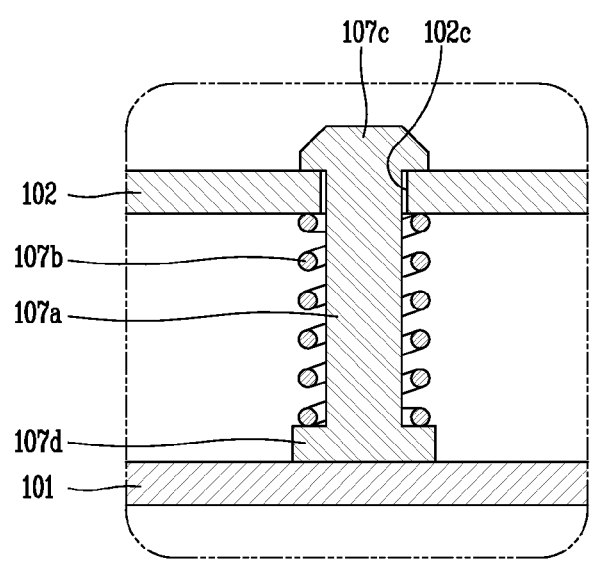
FIG. 8 is an enlarged sectional view of a holding unit illustrated in FIG. 4A.

FIG. 8 is an enlarged sectional view illustrating a portion of a holding unit 107 illustrated in FIG. 4A.

Referring to FIG. 8, a holding unit 107 may be disposed between the first support plate 101 and the second support plate 102, so as to prevent the second support plate 102 from being drooped due to its own weight. The holding unit 107 may preferably be disposed on a central portion of the second support plate 102, which is likely to be drooped. In the drawing, the holding unit 107 may be provided in plurality while being spaced apart from each other along a vertical direction of the second support plate 102 in the drawing.

The holding unit 107 may include a body 107a and an elastic member 107b. The body 107a may be supported by the first support plate 101, and inserted through a through hole 102c formed through the second support plate 102. The body 107a, as illustrated in FIG. 8, may have a form of being simply mounted on the first support plate 101 or being fixed onto the first supporting plate 101.

The elastic member 107b may be installed to cover the body 107a between the first support plate 101 and the second support plate 102, and elastically press against the second support plate 102. Therefore, the second support plate 102 may be prevented from being drooped. The elastic member 107b may be a spring, a sponge and the like, for example.

A first anti-separation portion 107c may be formed on one end portion of the body 107a, which protrudes from the rear surface of the second support plate 102 through the through hole 102c in a radial direction. The first anti-separation portion 107c may thus cover a portion of the rear surface of the second support plate 102. The first anti-separation portion 107c may be formed as a separate member to be inserted into the body 107a or integrally formed with the body 107a. Also, a second anti-separation portion 107d may be formed on another end portion of the body 107a by protruding in a radial direction from the body 107a to prevent a separation of the elastic member 107b.

As such, by the stopper 105b for limiting the rotation range of the hinge unit 103, the holding unit 107 for preventing drooping of the second support plate 102 due to its own weight, and the like, the image display device 100 may be provided with reliability and durability.

Figure 9:
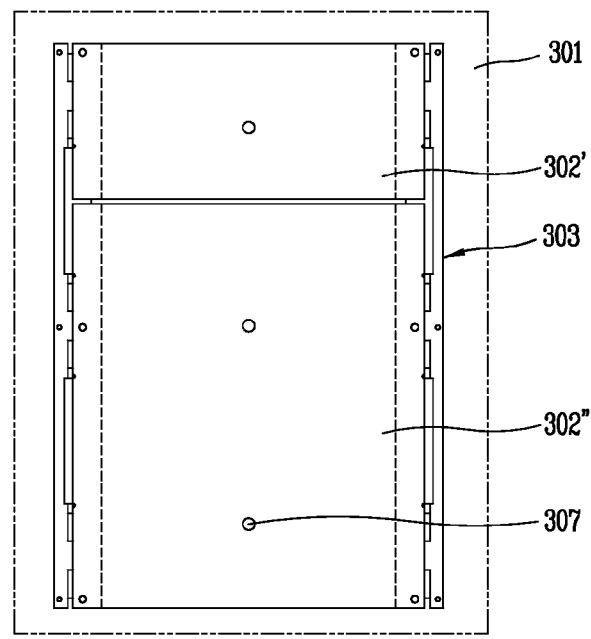
FIG. 9 is a rear view of an image display device in accordance with another exemplary embodiment of the present disclosure.

FIG. 9 is a rear view of an image display device 300 in accordance with another exemplary embodiment.

As illustrated in FIG. 9, a second support plate 302 may be provided in plurality so as to be arranged in a row. In this exemplary embodiment, the second support plates 302' and 302" with almost the same width as each other may be arranged along a vertical direction of a first support plate 301.

Hinge units 303 which are formed on both sides of the second support plate 302' and 302", respectively, may extend in one direction (corresponding to the lengthwise direction of the first support plate 301) and be connected to the plurality of second support plates 302' and 302", respectively. With the structure, the plurality of second support plates 302' and 302" may share the one hinge unit 303.

Figure 10:
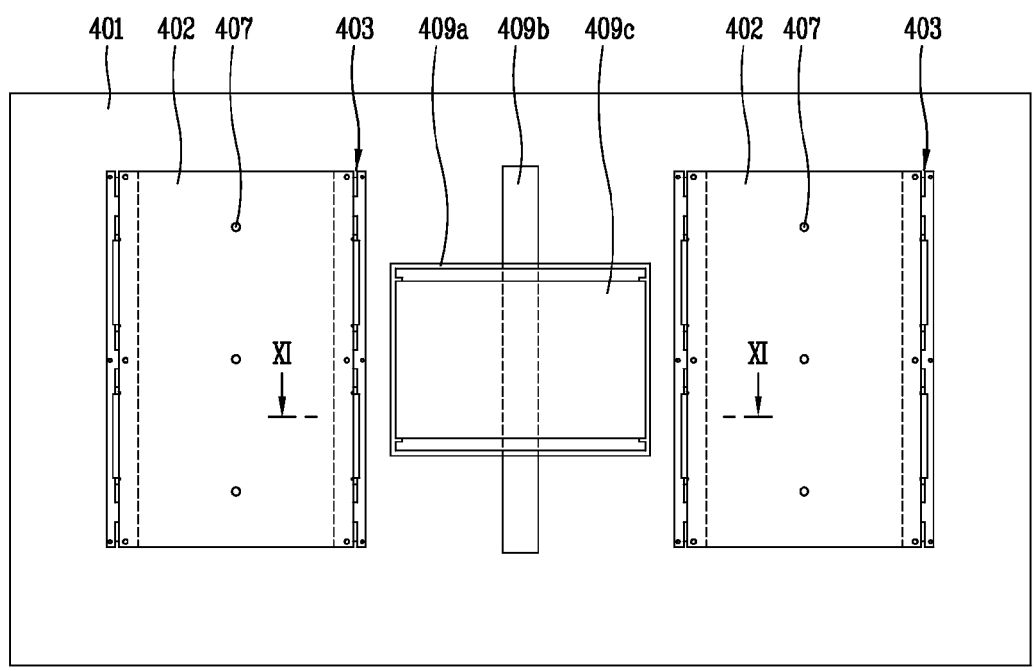
FIG. 10 is a rear view of an image display device in accordance with another exemplary embodiment of the present disclosure.
Figure 11:
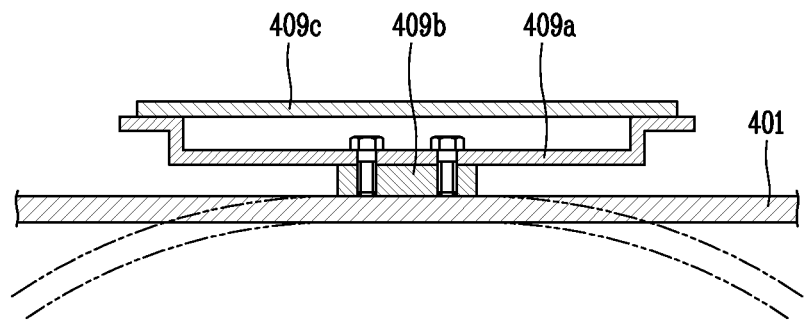
FIG. 11 is a sectional view taken along the line XI-XI of FIG. 10.

FIG. 10 is a rear view of an image display device 400 in accordance with another exemplary embodiment, and FIG. 11 is a sectional view taken along the line XI-XI of FIG. 10.

As illustrated in FIGS. 10 and 11, a third support plate 409a may be disposed on rear surface of the first support plate 401. In this exemplary embodiment, the third support plate 409a may be disposed between second support plates 402.

The third support plate 409a may have a circuit board 409c mounted thereon to generate a control signal relevant to a display. The control signal may include a power signal as well as a data signal related to driving of the display. The circuit board 409c and electronic devices (not shown) mounted thereon may configure a driving circuit unit for driving a panel. Meanwhile, the third support plate 409a itself may also be implemented as a circuit board.

A transformation reducing portion 409b may be disposed between the first support plate 401 and the third support plate 409a to maintain a flat state of the third support plate 409a upon transformation of the first support plate 401. The transformation reducing portion 409b may have a smaller area than the third support plate 409a so as to be minutely transformed during transformation of the first support plate 401. Accordingly, the third support plate 409a mounted on the transformation reducing portion 409b may remain flat, and the circuit board mounted on the third support plate 409a may also remain flat.

The transformation reducing portion 409b may be made of a combination of materials with different transformation rates so as to minimize its transformation caused due to the transformation of the first support plate 401. For example, the transformation reducing portion 409b may be configured with layers of different materials.

The foregoing embodiments and advantages are merely exemplary and are not to be construed as limiting the present disclosure. The present teachings can be readily applied to other types of devices. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. An image display device comprising: a display transformable between a flat state to a curved state: a first support plate disposed on a rear surface of the display and transformable together with the display: a second support plate spaced apart from a rear surface of the first support plate, and having electronic devices mounted thereon; and hinge units disposed at both sides of the second support plate and connecting the first support plate and the second support plate, wherein the second support plate is maintained in a flat state during transformation of the first support plate; wherein the second support plate is a ciruit board to generate a control signal related to the display; and wherein a rear cover is disposed to cover the second support plate, the rear cover being transformable in response to transformation of the first support plate, the rear cover is spaced apart from an edge of the second support plate by a predetermined gap to prevent from coming in contact with the second support plate upon the transformation.

2. The device of claim 1, wherein each of the hinge units comprises:
   a hinge bar coupled to the first support plate; and
   a hinge plate coupled to the hinge bar by the hinge, the hinge plate to support the second support plate.

3. The device of claim 2, wherein the hinge bar is mounted onto a first protruding portion protruding from the rear surface of the first support plate, such that the hinge plate is spaced apart from the rear surface of the first support plate.

4. The device of claim 3, wherein the second support plate is mounted onto a second protruding portion protruding from the hinge plate, such that the second support plate is spaced apart from the rear surface of the first support plate.

5. The device of claim 2, wherein the hinge bar comprises a first accommodating portion,
   wherein the hinge plate comprises a second accommodating portion disposed coaxially with the first accommodating portion, and
   wherein a pin is inserted into the first and second accommodating portions such that the hinge bar and the hinge plate are rotatable relative to each other.

6. The device of claim 5, wherein the hinge bar and the hinge plate extend along an axial direction of the pin, and
   wherein the first and second accommodating portions are disposed on a plurality of places including an end portion of the pin on an axis of the pin.

7. The device of claim 2, wherein the hinge plate comprises a stopper stopped at the hinge bar upon rotation of the hinge plate in one direction, so as to limit a rotation range of the hinge plate relative to the hinge bar.

8. The device of claim 7, wherein the stopper is disposed to cover a part of the hinge bar.

9. The device of claim 8, wherein an elastic member is disposed between the stopper and the hinge bar, the elastic member made of an elastically transformable material.

10. The device of claim 7, wherein the second support plate is disposed on the rear surface of the first support plate at a position protruding more than or higher than the stopper with respect to the first support plate.

11. The device of claim 1, wherein the second support plate is a circuit board to generate a control signal related to the display.

12. The device of claim 11, wherein the second support plate and the electronic devices mounted onto the second support plate configure a power supply unit to supply power to the display.

13. The device of claim 11, wherein a connector is disposed on an end portion of the circuit board to be coupled to another connector, and
wherein the connector is disposed on the rear surface of the second support plate at a position protruding more than or higher than the hinge unit with respect to the first support plate, to facilitate the another connector to be inserted into the connector without interference with the hinge unit.

14. The device of claim 1, wherein the second support plate is provided in plurality, to be arranged in a row, and
wherein the hinge units disposed on both sides of the second support plate extend in one direction to be connected to the plurality of second support plates, respectively.

15. The device of claim 1, further comprising a holding unit disposed between the first support plate and the second support plate, the holding unit preventing the second support plate from being drooped due to its own weight.

16. The device of claim 15, wherein the holding unit comprises:
a body supported by the first support plate and inserted through a through hole formed through the second support plate; and
an elastic member disposed between the first support plate and the second support plate to cover the body, the elastic member elastically pressing against the second support plate.

17. The device of claim 16, wherein the holding unit further comprises an anti-separation portion protruding from the body in a radial direction to cover a portion of a rear surface of the second support plate.

18. The device of claim 1, further comprising:
a third support plate spaced apart from the rear surface of the first support plate; and
a transformation reducing portion having a smaller area than the third support plate and connecting the first support plate and the third support plate to each other, the transformation reducing portion allowing the third support plate to resist transformation during the transformation of the first support plate.

19. An image display device comprising: a display transformable between a flat state to a curved state; a support plate disposed on a rear surface of the display and transformable together with the display; a plurality of protruding portions each protruding from a rear surface of the support plate, the plurality of protrusions being spaced apart from each other; a plurality of hinge bars mounted onto the plurality of protrusions, respectively; a plurality of hinge plates coupled to the plurality of hinge bars, respectively, by hinges; circuit board supported by the plurality of hinge plates, and to generate a control signal related to the display, wherein the circuit board remains flat as the hinge bars are rotated with respect to the hinge plates during transformation of the support plate; and wherein a rear cover is disposed to cover the circuit board the rear cover being transformable in response to transformation of the first support plate, wherein the rear cover is spaced apart from an edge of the circuit board by a predetermined gap to prevent from coming in contact with the circuit board upon the transformation.

* * * * *